(12) United States Patent
Sinha et al.

(10) Patent No.: US 8,148,770 B1
(45) Date of Patent: Apr. 3, 2012

(54) MEMORY DEVICE WITH BURIED BIT LINE STRUCTURE

(75) Inventors: Shankar Sinha, Redwood Shores, CA (US); Timothy Thurgate, Sunnyvale, CA (US)

(73) Assignee: Spansion LLC, Sunnyvale, CA (US)

( * ) Notice: Subject to any disclaimer, the term of this patent is extended or adjusted under 35 U.S.C. 154(b) by 562 days.

(21) Appl. No.: 11/165,329

(22) Filed: Jun. 24, 2005

(51) Int. Cl.
*H01L 29/792* (2006.01)
*H01L 23/52* (2006.01)
*H01L 29/40* (2006.01)
*H01L 27/088* (2006.01)
*H01L 21/70* (2006.01)
*H01L 23/48* (2006.01)
*H01L 21/82* (2006.01)
*H01L 21/336* (2006.01)
*H01L 21/76* (2006.01)
*H01L 21/44* (2006.01)
*H01L 29/788* (2006.01)

(52) U.S. Cl. ........ 257/324; 257/208; 257/316; 257/401; 257/513; 257/774; 257/775; 257/E29.309; 257/E21.423; 257/E21.619; 438/128; 438/257; 438/287; 438/424; 438/672; 438/954

(58) Field of Classification Search .................. None
See application file for complete search history.

(56) References Cited

U.S. PATENT DOCUMENTS

| | | | | |
|---|---|---|---|---|
| 5,384,475 A * | 1/1995 | Yahata | ........................ | 257/314 |
| 5,666,002 A * | 9/1997 | Yamamoto et al. | ........... | 257/621 |
| 6,011,725 A * | 1/2000 | Eitan | ........................ | 365/185.33 |
| 6,503,787 B1 * | 1/2003 | Choi | ........................ | 438/214 |
| 6,696,724 B2 * | 2/2004 | Verhaar | ........................ | 257/314 |
| 2003/0146455 A1 * | 8/2003 | Abedifard | ........................ | 257/213 |
| 2004/0095795 A1 * | 5/2004 | Tran | ........................ | 365/63 |
| 2005/0242391 A1 * | 11/2005 | She et al. | ........................ | 257/324 |

* cited by examiner

*Primary Examiner* — Hoang-Quan Ho
(74) *Attorney, Agent, or Firm* — Harrity & Harrity, LLP

(57) ABSTRACT

A memory device includes a number of memory cells and a bit line structure coupled to a group of the memory cells. The bit line structure includes an upper portion having a first width, and a lower portion having a second width, where the first width is less than the second width.

7 Claims, 11 Drawing Sheets

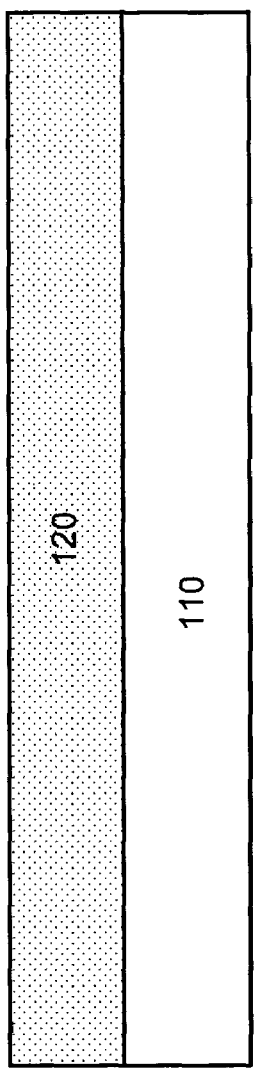
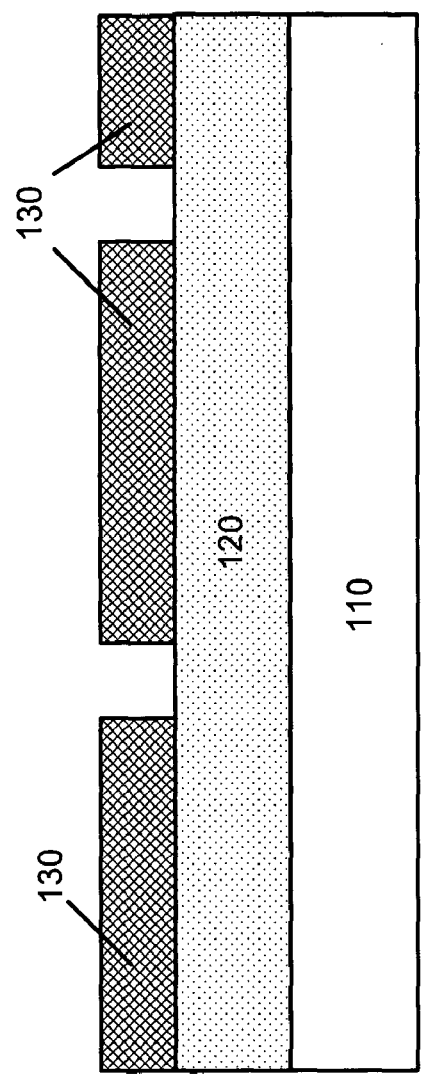

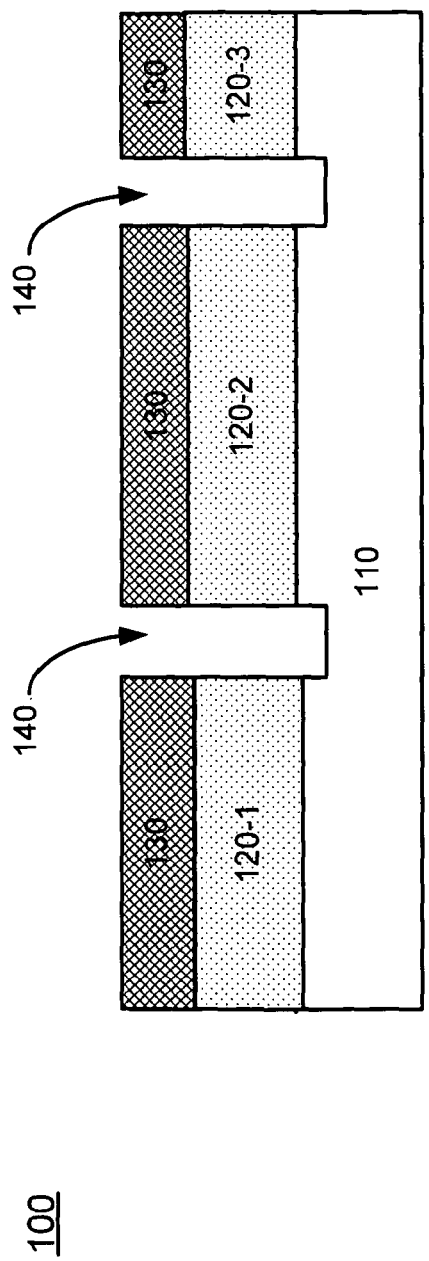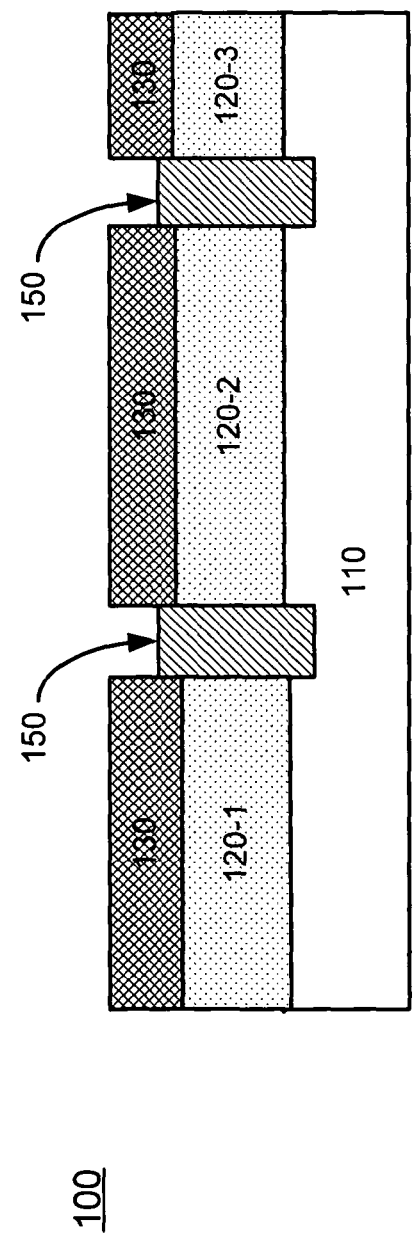

MEMORY DEVICE WITH BURIED BIT LINE STRUCTURE

TECHNICAL FIELD

The present invention relates generally to semiconductor devices and methods of manufacturing semiconductor devices. The invention has particular applicability to memory devices and forming memory devices having buried bit line structures.

BACKGROUND ART

The escalating demands for high density and performance associated with non-volatile memory devices, such as electrically erasable programmable read only memory (EEPROM) devices, require small design features, high reliability and increased manufacturing throughput. The reduction of design features, however, challenges the limitations of conventional methodology. For example, the reduction of design features makes it difficult for the memory device to meet its expected data retention requirement.

One particular problem with scaling memory devices to reduce the die size is that the memory devices often exhibit degraded performance. For example, reducing the size of various conductive structures in the memory device, such as bit lines, often results in increased resistance associated with the bit lines. This increased resistance may require an increase in the voltage to program and/or erase the memory cells in the memory device, which may cause additional problems. These problems may make it difficult for the memory device to be efficiently programmed and/or erased and, ultimately, may lead to device failure.

DISCLOSURE OF THE INVENTION

Advantages and features of the invention will be set forth in part in the description which follows and in part will become apparent to those having ordinary skill in the art upon examination of the following or may be learned from the practice of the invention. The advantages and features of the invention may be realized and obtained as particularly pointed out in the appended claims.

According to one aspect consistent with the invention, a memory device is provided. The memory device includes a substrate, a conductive layer formed over the substrate, a semiconducting layer formed over the conductive layer, a source region and a drain region. The memory device also includes a bit line formed over the conductive layer and adjacent the semiconducting layer, where the bit line is configured to electrically couple at least one of the source region or drain region to the conductive layer. The memory device further includes a first dielectric layer formed over the conductive layer, a charge storage element formed over the first dielectric layer, a second dielectric layer formed over the charge storage element and a control gate formed over the second dielectric layer.

According to another aspect consistent with the invention, a non-volatile memory device that includes a plurality of memory cells is provided. Each of the memory cells includes a dielectric layer formed over a substrate, a charge storage element formed over the dielectric layer, an inter-gate dielectric formed over the charge storage element and a control gate formed over the inter-gate dielectric. The non-volatile memory device also includes a plurality of bit lines, where each of the bit lines is coupled to at least one of a source region or drain region associated with a respective group of memory cells. The non-volatile memory device further includes a plurality of conductive regions formed over the substrate and below the bit lines, where each of the conductive regions is electrically coupled to a respective one of the bit lines to form a bit line structure.

According to a further aspect consistent with the invention, a memory device includes a plurality of memory cells. The memory device also includes a bit line structure coupled to at least one of the memory cells. The bit line structure includes an upper portion having a first width and a lower portion having a second width, where the first width is less than the second width.

Other advantages and features of the invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, wherein elements having the same reference number designation may represent like elements throughout.

FIGS. 1A-1D are cross-sections illustrating the formation of buried bit line structures in accordance with an embodiment of the invention.

BEST MODE FOR CARRYING OUT THE INVENTION

Figure 2A:
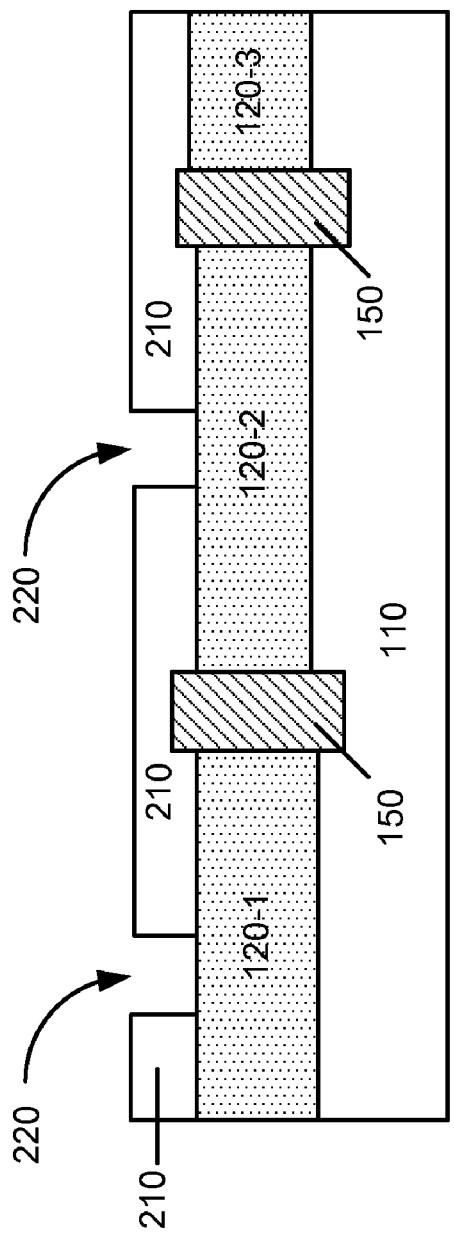
FIGS. 2A-2D are cross-sections illustrating the formation of bit lines in accordance with an embodiment of the invention.

Implementations consistent with the invention provide memory devices with buried bit line structures. The buried bit line structures may allow the memory device to be scaled to smaller sizes by reducing the width of bit lines connecting a number of memory cells.

FIG. 1A is a cross-section illustrating an exemplary semiconductor device on which memory cells may be formed in accordance with an embodiment of the invention. Referring to FIG. 1A, semiconductor device 100 may include layer 110 and layer 120. In an exemplary embodiment, layer 110 may be a substrate of semiconductor device 100 and may include silicon (e.g., polycrystalline silicon), germanium, silicon-germanium or other semiconducting materials. In alternative implementations, layer 110 may be a conductive layer or a dielectric layer formed a number of layers above the surface of a substrate in semiconductor device 100.

In an exemplary embodiment, layer 120 may be an epitaxial layer formed on layer 110. Layer 120 may have a thickness ranging from about 200 angstroms (Å) to about 2,000 Å. Layer 120 may include silicon (e.g., polycrystalline silicon) doped with n-type impurities, such as phosphorous or arsenic. Alternatively, layer 120 may include other semiconducting materials, such as germanium or silicon-germanium doped with either n-type or p-type impurities. Layer 120 may be used to form buried bit line structures for semiconductor device 100.

In an exemplary implementation, a mask 130 may be formed over layer 120, as illustrated in FIG. 1B. The pattern associated with mask 130 may expose portions of layer 120 where trenches may be formed.

Trenches 140 may be formed in layer 120 and a portion of substrate 110, as illustrated in FIG. 1C. Trenches 140 may be formed in a conventional manner, such as a dry etching process. In an exemplary implementation, trenches 140 may have a width ranging from about 200 Å to about 500 Å. In one exemplary implementation, trenches 140 may extend to a depth ranging from about 200 Å to about 1,000 Å below the upper surface of substrate 110. Trenches 140 function to separate layer 120 into a number of portions, labeled 120-1, 120-2 and 120-3 in FIG. 1C. Each of these portions of layer 120, referred to herein individually as a region 120 or collectively as regions 120, may function as a buried bit line structure, as described in more detail below.

Trenches 140 may be filled with a dielectric material, such as a silicon oxide (e.g., $SiO_2$), to form isolation regions 150, as illustrated in FIG. 1D. Isolation regions 150 function to electrically isolate one region 120 (e.g., region 120-1) from an adjacent region 120 (e.g., region 120-2). As illustrated in FIG. 1D, isolation regions 150 may protrude a small amount above the upper surface of regions 120. This helps ensure that each of regions 120 is electrically isolated from an adjacent region 120.

Mask 130 may be removed and a mask layer 210 may be formed over semiconductor device 100, as illustrated in FIG. 2A. Mask layer 210 may include, for example, an oxide or a nitride material. Mask layer 210 may be formed with openings 220, as illustrated in FIG. 2A. Openings 220 may be used to formed contacts to regions 120.

Figure 2B:
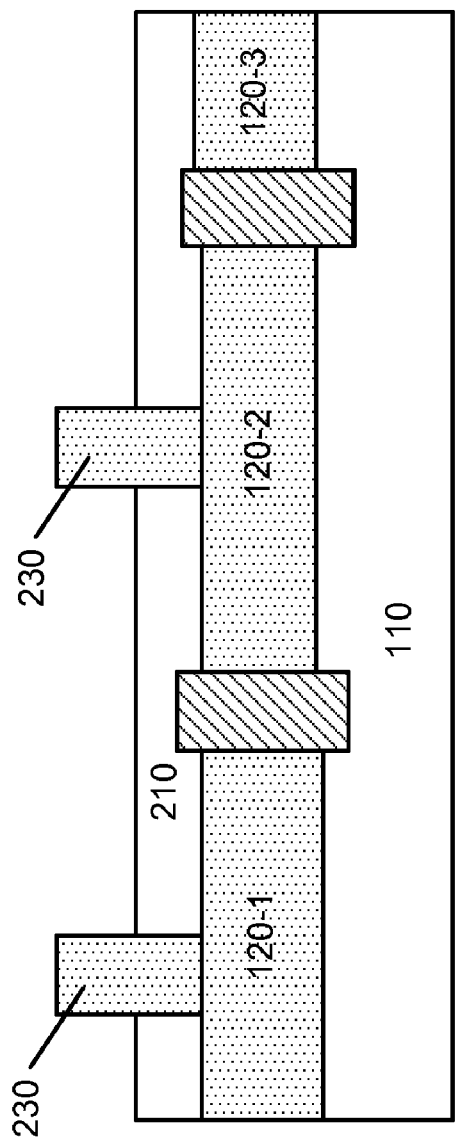

A selective epitaxial growth process may then be performed to grow portions of layer 120 up through openings 220 to form bit lines 230, as illustrated in FIG. 2B. In an exemplary implementation, bit lines 230 may have a width ranging from about 100 Å to about 500 Å and a height ranging from about 500 Å to about 2,000 Å. Advantageously, bit lines 230 may be formed to have a much narrower width than conventional bit lines due to the presence of the buried bit line structures (i.e., regions 120).

For example, each region 120, such as region 120-1, and the bit line 230 electrically coupled to region 120-1 together function as a bit line structure that may be used to program and/or erase a group (e.g., a column) of memory cells in semiconductor device 100. The combined bit line structure, therefore, includes a relatively wide "buried" bit line portion (i.e., region 120-1) and a narrower upper portion (i.e., bit line 230). In an exemplary implementation, the width of regions 120 may be at least three times as wide as bit lines 230. Since regions 120 and a corresponding bit line 230 are electrically connected, the overall width of bit lines 230 may be narrower than the width of bit lines in conventional memory devices. For example, bit lines 230 may be about 70 percent narrower than bit lines in conventional memory devices without increasing the overall resistance of the overall bit line structures. In this manner, the overall size of semiconductor device 100 may be reduced by reducing the width of bit lines 230.

Figure 2C:
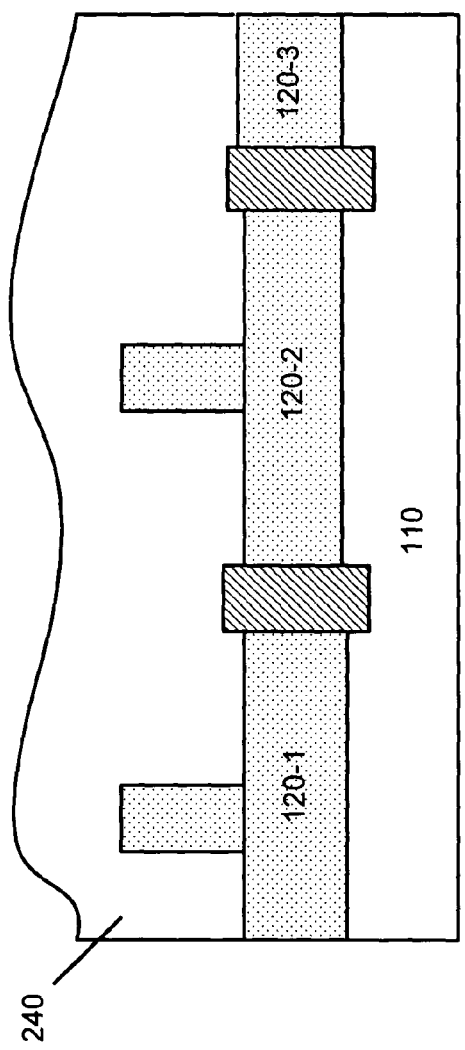

Mask layer 210 may then be removed. A semiconducting layer 240 may then be deposited over semiconductor device 100, as illustrated in FIG. 2C. In an exemplary embodiment, semiconducting layer 240 may include the same or a similar material as substrate 110. For example, semiconducting layer 240 may include polycrystalline silicon. Alternatively, semiconducting layer 240 may include other semiconducting materials, such as germanium or silicon-germanium. Layer 240 may be deposited to a thickness ranging from about 500 Å to about 3,000 Å.

Figure 2D:
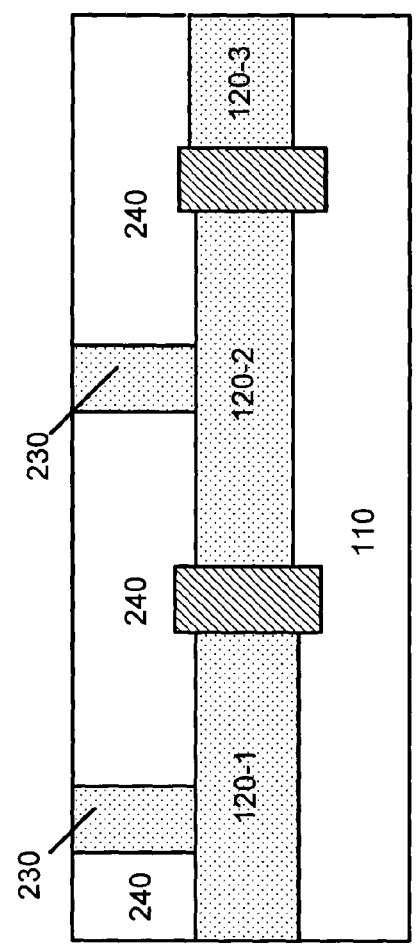

Layer 240 may optionally be planarized as illustrated in FIG. 2D. For example, a chemical-mechanical polishing (CMP) process may be performed to planarize the top surface of layer 240. In an exemplary embodiment, layer 240 may have a thickness ranging from about 500 Å to about 2,000 Å after planarization.

Figure 3A:
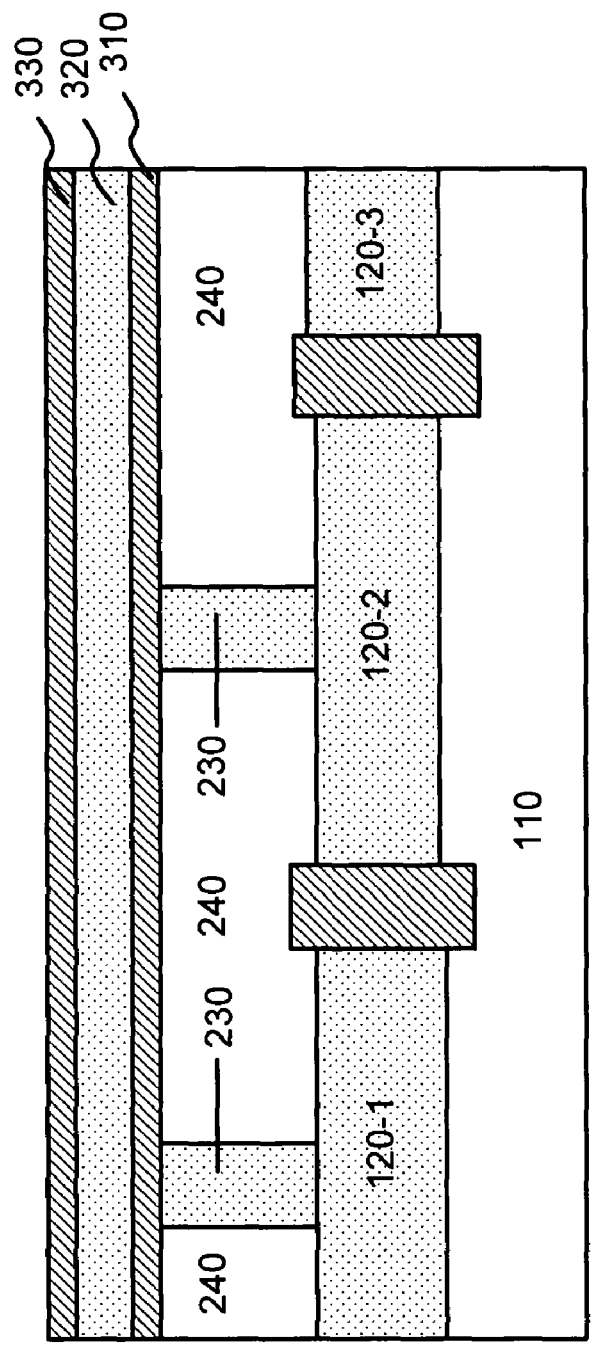
FIGS. 3A and 3B are cross-sections illustrating the formation of exemplary layers used to form a memory cell in accordance with an embodiment of the invention.

One or more layers may then be formed over semiconductor device 100. For example, layers 310, 320 and 330 may formed over semiconductor device 100, as illustrated in FIG. 3A. Layer 310 may be a dielectric layer formed on layer 240 and bit lines 230 in a conventional manner. In an exemplary implementation, dielectric layer 310 may include an oxide, such as a silicon oxide (e.g., $SiO_2$), and may have a thickness ranging from about 30 Å to about 100 Å. Dielectric layer 310 may function as a tunnel oxide layer for subsequently formed memory cells of semiconductor device 100. Alternatively, layer 310 may include a dielectric material having a high K value, such as a K value greater than 3.9 (i.e., the K value of $SiO_2$). For example, layer 310 may include an aluminum oxide (e.g., $Al_2O_3$), a hafnium oxide (e.g., $HfO_2$), or a zirconium oxide (e.g., $ZrO_2$).

Layer 320 may be formed on layer 310 in a conventional manner and may include a dielectric material, such as a nitride (e.g., a silicon nitride such as $Si_3N_4$) or an oxide (e.g., an aluminum oxide, such as $Al_2O_3$, or a hafnium oxide, such as $HfO_2$). Layer 320, consistent with the invention, may act as a charge storage layer for semiconductor device 100 and may have a thickness ranging from about 30 Å to about 100 Å. In alternative implementations, layer 320 may include a conductive material, such as polycrystalline silicon, used to form a floating gate electrode. In still other alternative implementations, layer 320 may include a number of small crystalline structures, such as nano-crystals, that may be used to store charges.

Layer 330 may be formed on layer 320 in a conventional manner and may include a dielectric material, such as an oxide (e.g., $SiO_2$). Alternatively, layer 330 may include a material having a high K value, such as aluminum oxide (e.g., $Al_2O_3$), hafnium oxide ($HfO_2$) or zirconium oxide ($ZrO_2$), that may be deposited or thermally grown on layer 320. In still other alternatives, layer 330 may be a composite that includes a number of dielectric layers or films, where one or more of the layers may be a high K layer. Layer 330 may have a thickness ranging from about 50 Å to about 200 Å and may function as an inter-gate dielectric for memory cells in semiconductor device 100.

Figure 3B:
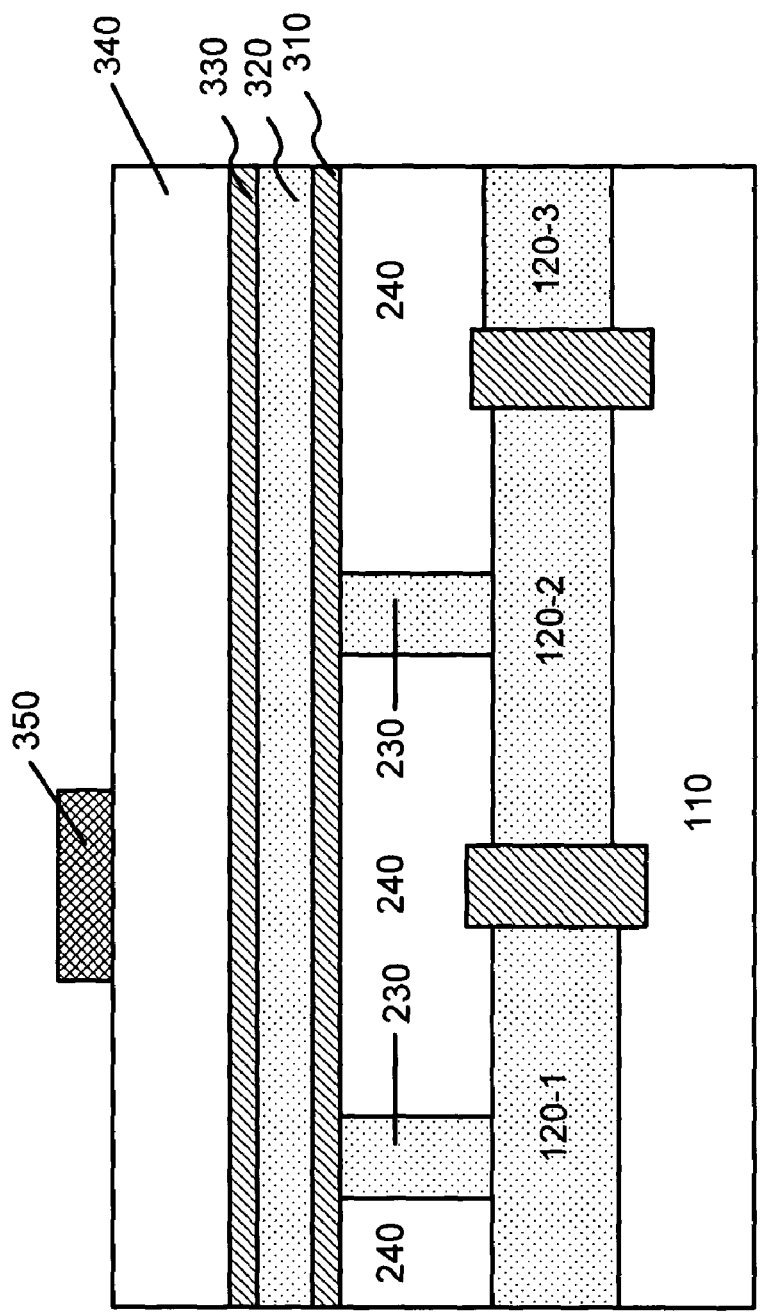

Layer 340 may be deposited over layer 330, as illustrated in FIG. 3B. Layer 340 may include a conductive material, such as polycrystalline silicon, formed on layer 330 in a conventional manner. Alternatively, layer 340 may include other semiconducting materials, such as germanium or silicon-germanium, or various metals, such as titanium or tungsten. Layer 340, consistent with the invention, may be used to form one or more control gate electrodes for one or more memory cells in semiconductor device 100. In an exemplary implementation, layer 340 may have a thickness ranging from about 200 Å to about 1,000 Å. An optional silicide layer, such as titanium silicide (not shown) may be formed on layer 340.

A photoresist material may be patterned and etched to form mask 350 on the top surface of layer 340, as illustrated in FIG. 3B. Mask 350 may be used to facilitate formation of memory cells in semiconductor device 100, as described in more detail below.

Figure 4:
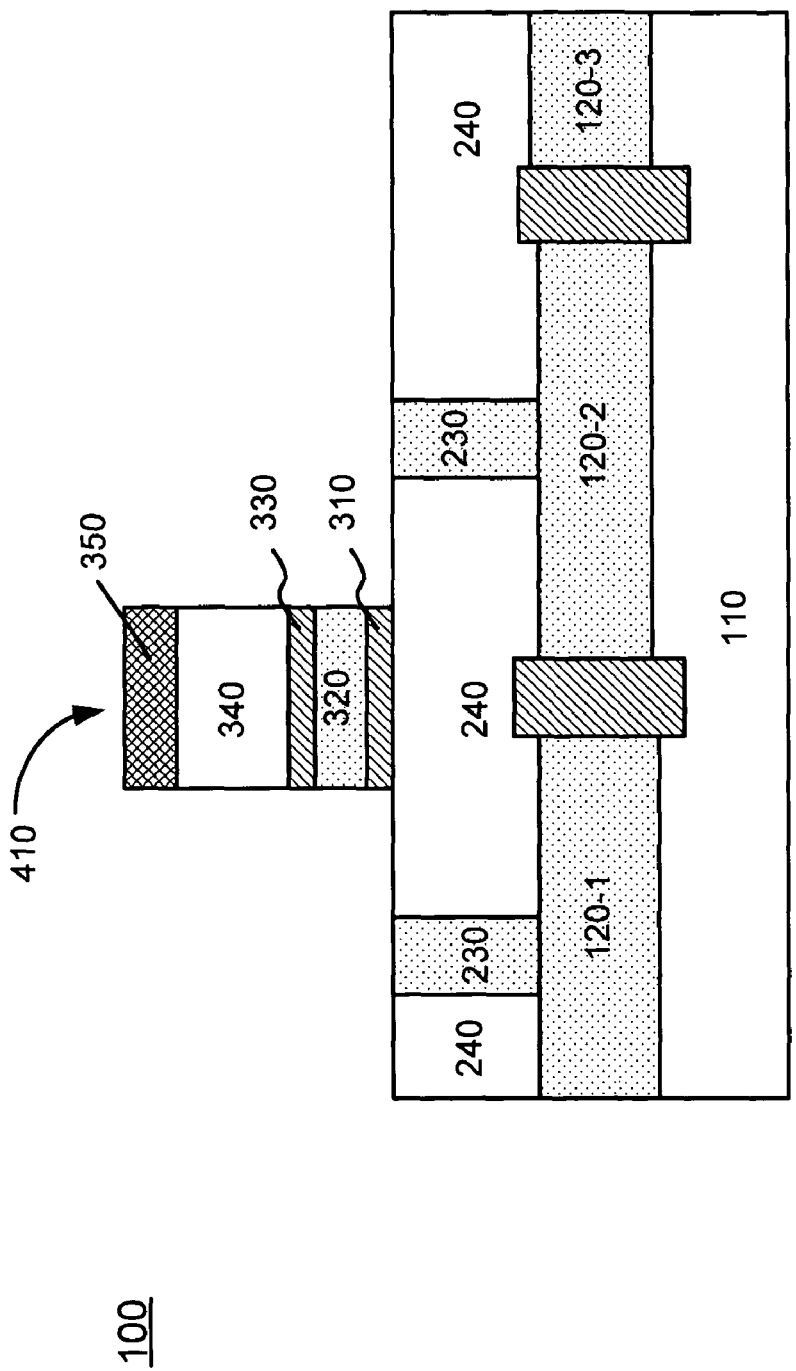
FIG. 4 is a cross-section illustrating an exemplary memory cell formed in accordance with an embodiment of the invention.

Semiconductor device 100 may then be etched, as illustrated in FIG. 4. Referring to FIG. 4, layers 310-340 may be etched in a conventional manner with the etching terminating at layer 240, thereby forming structure 410. In alternative implementations, the etching may terminate at another layer, such as layer 320. In still other alternative implementations, layer 340 (and layers 310-330) may not be etched, thereby forming a continuous word line structure for a number of memory cells in a row of semiconductor device 100.

Structure 410 (also referred to herein as a memory cell 410) may represent a memory cell of semiconductor device 100, where memory cell 410 includes a dielectric layer 310, a charge storage layer 320, an inter-gate dielectric layer 330 and a control gate 340. Only one memory cell 410 is illustrated in semiconductor device 100 in FIG. 4 for simplicity. It should be understood that semiconductor device 100 may typically include a memory array including a large number of memory cells 410.

Figure 5:
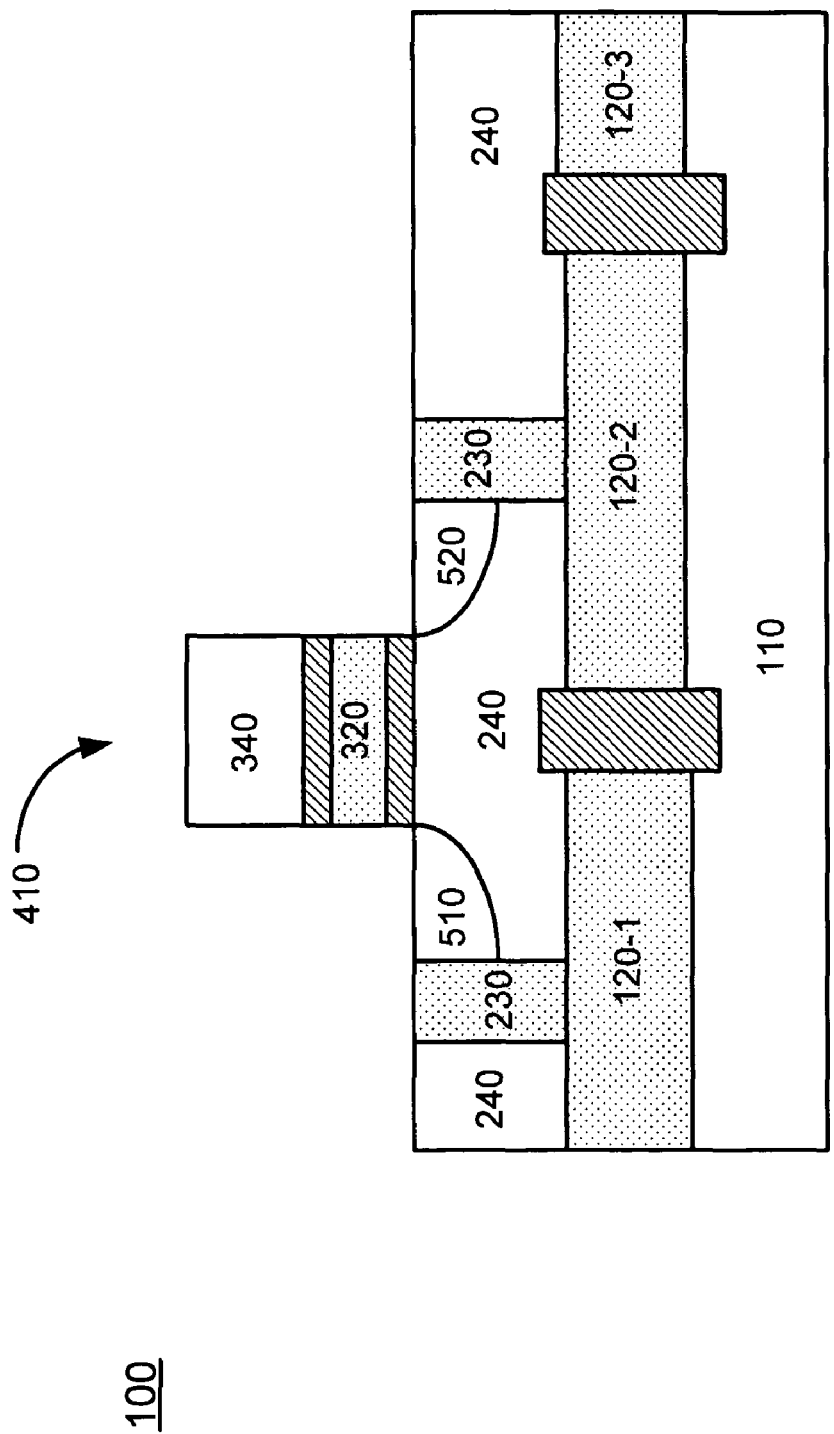
FIG. 5 is a cross-section illustrating the formation of source/drain regions in the device of FIG. 4 in accordance with an embodiment of the invention.

Source and drain regions 510 and 520 may be formed in layer 240, as illustrated in FIG. 5. For example, n-type or p-type impurities may be implanted in layer 240 to form source and drain regions 510 and 520, based on the particular end device requirements. The particular implantation dosages and energy used to form source and drain regions 510 and 520 may be selected based on the particular end device requirements. One of ordinary skill in the art would be able to optimize the source/drain implantation process based on the particular circuit requirements. It should also be understood that source region 510 and drain region 520 may alternatively be formed at other points in the fabrication process of semiconductor device 100. For example, sidewall spacers may be formed prior to the source/drain ion implantation to control the location of the source/drain junctions based on the particular circuit requirements.

The source region 510 and/or drain region 520 may be coupled to one of bit lines 230. For example, drain region 520 may be coupled to the bit line 230 located to the right of memory cell 410 illustrated in FIG. 5. A voltage may then be supplied to drain region 520, and optionally, to drain regions of other memory cells 410 (not shown) located in the same column by applying a voltage to bit line 230. As discussed above, since bit line 230 is coupled to region 120-2, these two structures form a conductive bit line structure that is able to apply the desired voltage to each of the drain regions in the group (e.g., column) of memory cells 410.

Figure 6:
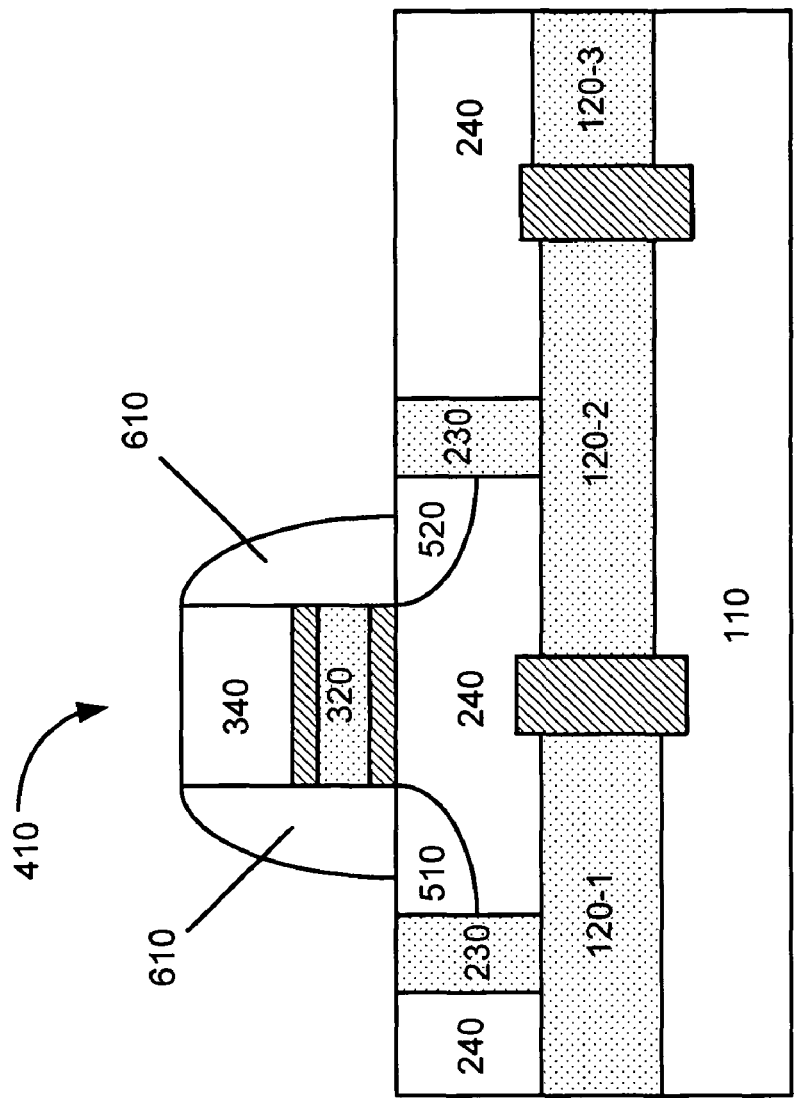
FIG. 6 is a cross-section illustrating the formation of spacers on the device of FIG. 5 in accordance with an embodiment of the invention.

Photoresist mask 350 may be removed using a conventional process. Spacers 610 may optionally be formed adjacent the sidewalls of memory cell 410, as illustrated in FIG. 6. For example, a dielectric material, such as a silicon oxide, a silicon nitride, a silicon oxynitride or another dielectric material, may be deposited and etched to form spacers 610 on each side of memory cell 410, as illustrated in FIG. 6. Spacers 610 may be used to electrically isolate adjacent memory cells 410 from each other. Spacers 610 may also be used to facilitate the deposition of impurities in semiconductor device 100.

Figure 7A:
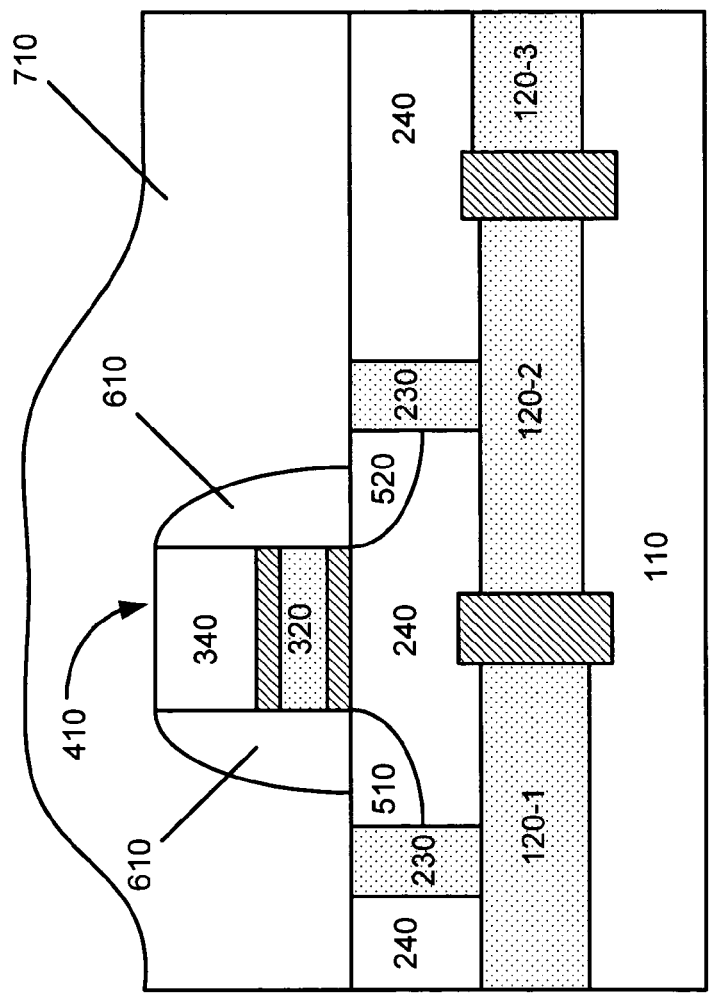
FIGS. 7A and 7B are cross-sections illustrating the formation of an interlayer dielectric on the device of FIG. 6 in accordance with an embodiment of the invention.

An interlayer dielectric (ILD) 710 may be formed over memory cell 410, bit lines 230 and layer 240, as illustrated in FIG. 7A. In an exemplary implementation, ILD 710 may include an oxide (e.g., $SiO_2$), phosphosilicate glass (PSG) material, a boro-phosphosilicate glass (BPSG) material or some other dielectric material. The thickness of ILD 710 may range from about 1,000 Å to about 5,000 Å.

Figure 7B:
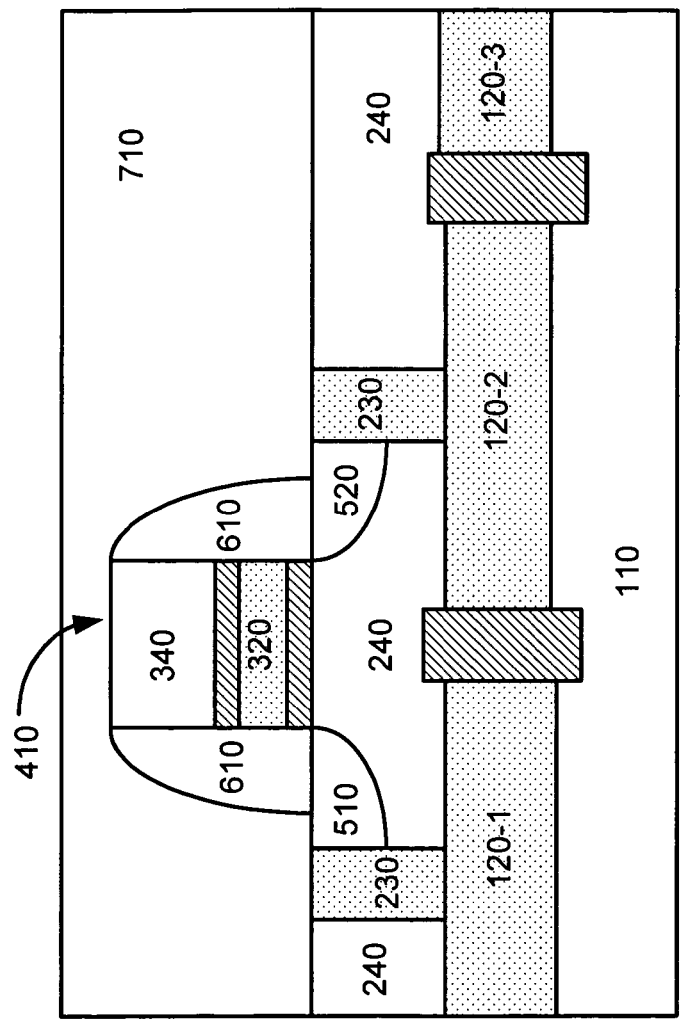

ILD 710 may optionally be planarized using a conventional process, such as a CMP process, as illustrated in FIG. 7B. Referring to FIG. 7B, the CMP process may planarize the top surface of ILD 710 to facilitate formation of subsequent structures, such as interconnect lines. ILD 710, consistent with the invention, may represent an ILD located closest to substrate 110. In alternative implementations, ILD 710 may represent an interlayer dielectric formed a number of layers above the surface of substrate 110. In each case, ILD 710 functions to isolate various conductive structures, such as various interconnect lines described below or to isolate source region 510 or drain region 520 from other conductive structures.

A contact hole/trench (not shown) may be formed in ILD 710 using conventional photolithographic and etching techniques. Next, a metal layer (not shown), such as tungsten, copper or aluminum, may be deposited to fill the contact hole to form a contact to, for example, drain region 520.

A conductive interconnect line (not shown) may then be formed over the planarized top surface of ILD 710. The interconnect line may include a metal, such as copper, aluminum or tungsten, and may connect various features in semiconductor device 100, such as source or drain regions 510/520 through one or more contacts to an external electrode (not shown). Alternatively, the interconnect line may connect various memory cells 410 in semiconductor device 100 and may facilitate programming or erasing memory cells 410 in semiconductor device 100.

Various back end of line (BEOL) processing may be performed to complete the fabrication of semiconductor device 100. For example, one or more additional ILDs, conductive lines and contacts may be formed in semiconductor device 100. A top dielectric layer, also referred to as cap layer, may be formed over the top most conductive layer and may act as a protective layer to prevent damage to semiconductor device 100, such as to protect against impurity contamination during subsequent cleaning processes that may be used to complete a working memory device.

Memory cell 410 may be programmed by, for example, applying a voltage of about 5 volts to about 10 volts to control gate 340 and applying a voltage of about 3 volts to about 5 volts to the bit line 230 coupled to drain region 520. Advantageously, the voltage applied to bit line 230 may be effectively supplied to a number of memory cells 410 (not shown) via the bit line structure that includes both bit line 230 and a corresponding one of regions 120. This enables the desired voltage to be applied to each of the drain regions in the group (e.g., column) of memory cells 410 without concern for increased resistance associated with narrow bit line 230.

As described above, in an exemplary embodiment, semiconductor device 100, illustrated in FIG. 7B, may be a memory device that uses a dielectric material, such as $Si_3N_4$, to form charge storage layer 320. Each memory cell 410 may be an EEPROM type memory device and one or more programming circuits (not shown) may be used to facilitate programming and erasing of one or more memory cells 410 of semiconductor device 100. Once programmed, electrons remain trapped in layer 320 until an erase procedure is performed.

In an exemplary implementation consistent with the invention, each of the memory cells 410 in semiconductor device 100 may be configured to store two bits of data. That is, charge storage layer 320 may be programmed to store charges representing two separate bits of data by localizing the first and second charges to the respective left and right sides of charge storage layer 320 illustrated in FIG. 7B. Each of the two bits of memory cell 410 may be programmed independently by, for example, channel hot electron injection, to store a charge representing a bit on each respective side of the charge storage layer 320. In this manner, the charges in charge storage layer 320 become effectively trapped on each respective side of charge storage layer 320. Erasing of each bit in memory cell 410 may also be performed independently. During erasing, the charges stored in charge storage layer 320 may tunnel through dielectric layer 310 into source region 510 and drain region 520, respectively.

In this manner, the density of the array of memory cells 410 in semiconductor device 100 may be increased as compared to conventional memory devices that store only one bit of data per cell. In alternative implementations, each memory cell 410 may be configured to store one bit of data per memory cell 410. In addition, in alternative implementations, semiconductor device 100 may be a floating gate memory device in which charge storage layer 320 is formed from a conductive material, such as polycrystalline silicon, and functions as a charge storage element for each memory cell 410.

In summary, bit line structures may be formed with an upper portion that is relatively narrow and a lower portions that is relatively wide. The bit line structure advantageously enables reduction in the width of the upper portion of the bit line structure (i.e., bit lines 230) without adversely impacting programming or erasing of memory cells 410. Therefore, the bit line structure advantageously helps reduce the size of the memory device, while maintaining or increasing the reliability for the memory device.

In the previous descriptions, numerous specific details are set forth, such as specific materials, structures, chemicals, processes, etc., in order to provide a thorough understanding of the invention. However, implementations consistent with principles of the invention can be practiced without resorting to the details specifically set forth herein. In other instances, well known processing structures have not been described in detail, in order not to unnecessarily obscure the thrust of the invention.

For example, the dielectric and conductive layers used in manufacturing a semiconductor device in accordance with the invention can be deposited by conventional deposition techniques. For example, various types of chemical vapor deposition (CVD) processes, including low pressure chemical vapor deposition (LPCVD) and enhanced chemical vapor deposition (ECVD) can be employed. In addition, conventional electroplating, photolithographic and etching techniques may also be employed, and hence, the details of such techniques have not been set forth herein in detail.

Implementations of the invention are applicable in the manufacturing of semiconductor devices and particularly in memory devices having small design features and high circuit density. The invention is applicable to the formation of any of various types of semiconductor devices, and hence, details have not been set forth in order to avoid obscuring the thrust of the invention.

In addition, no element, act or process used in the description of the invention should be construed as critical or essential to the invention unless explicitly described as such. Also, as used herein, the article "a" is intended to include one or more items. Where only one item is intended, the term "one" or similar language is used.

Only the preferred embodiments of the invention and a few examples of its versatility are shown and described in the present disclosure. It is to be understood that the invention is capable of use in various other combinations and environments and is capable of modifications within the scope of the inventive concept as expressed herein.

What is claimed is:

1. A memory device, comprising:
a substrate;
a conductive layer formed over the substrate, where the conductive layer comprises a plurality of conductive regions, each of the conductive regions having a width ranging from about 500 Å to about 2,000 Å;
a semiconducting layer formed over the conductive layer;
a source region;
a drain region;
a bit line formed over the conductive layer and adjacent the semiconducting layer, the bit line to electrically couple at least one of the source region or drain region to the conductive layer, where a width of the bit line ranges from about 100 Å to about 500 Å;
a first dielectric layer formed over the conductive layer;
a charge storage element formed over the first dielectric layer;
a second dielectric layer formed over the charge storage element;
a control gate formed over the second dielectric layer; and
a plurality of dielectric regions, and
where each of the plurality of conductive regions is separated from an immediately adjacent conductive region by one of the dielectric regions, and where a first one of the plurality of conductive regions is coupled to the bit line and forms part of a bit line structure.

2. The memory device of claim 1, where the conductive layer comprises doped polycrystalline silicon.

3. The memory device of claim 1, where the bit line structure is electrically coupled to drain regions associated with a plurality of memory cells.

4. The memory device of claim 3, where the bit line and the conductive layer each comprise polycrystalline silicon doped with n-type impurities.

5. The memory device of claim 1, where the charge storage element comprises silicon nitride.

6. The memory device of claim 1, where the charge storage element is to store charges representing two bits of information for a memory cell.

7. The memory device of claim 1, where an upper surface of each of the plurality of dielectric regions protrudes above an upper surface of the adjacent conductive regions.

* * * * *